United States Patent
Buettner et al.

(10) Patent No.: US 6,614,265 B2
(45) Date of Patent: Sep. 2, 2003

(54) STATIC LOGIC COMPATIBLE MULTIPORT LATCH

(75) Inventors: Stefan Buettner, Sindelfingen (DE);
Guenter Mayer, Stuttgart (DE);
Juergen Pille, Stuttgart (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,260

(22) Filed: Dec. 5, 2001

(65) Prior Publication Data

US 2002/0149408 A1 Oct. 17, 2002

(30) Foreign Application Priority Data

Dec. 5, 2000 (EP) ............................................. 00126689

(51) Int. Cl.[7] ............................................. H03K 19/00
(52) U.S. Cl. ............................. 326/96; 326/93; 326/38
(58) Field of Search ............................ 326/37, 38, 46, 326/93–98

(56) References Cited

U.S. PATENT DOCUMENTS

| 5,543,731 A | * | 8/1996 | Sigal et al. .................... 326/40 |
| 5,568,076 A | * | 10/1996 | Pelella et al. ................ 327/174 |
| 5,621,338 A | * | 4/1997 | Liu et al. ...................... 326/46 |
| 5,767,717 A | | 6/1998 | Schorn et al. ............... 327/210 |

* cited by examiner

*Primary Examiner*—Don Le
(74) *Attorney, Agent, or Firm*—Anthony J. Canale

(57) ABSTRACT

The invention describes a high-performance static logic compatible multiport latch. The latch is controlled by at least a first and a second clock (CLK 1, CLK 2), which consist of at least first and second data input ports (107, 111) with together at least three data inputs (DATA 1.1, ..., DATA 1.*n*, DATA 2.1, ..., DATA 2.*n*) and at least one data output (OUT). The first clock (CLK 1) controls whether data (DATA 1.1, ..., DATA 1.*n*) applied to the first data input ports (107) is stored in or clocked through the latch (100), the second clock (CLK 2) controls whether data (DATA 2.1, ..., DATA 2.*n*) applied to the second data input ports (111) is stored in or clocked through the latch, and either the first clock (CLK 1) or the second clock (CLK 2) clocks data into the latch at the same time.

11 Claims, 1 Drawing Sheet

STATIC LOGIC COMPATIBLE MULTIPORT LATCH

BACKGROUND OF THE INVENTION

1. Field of the Invention

The present invention relates in general to digital circuits, and more particularly to high-speed data latching circuits for temporarily storing digital information.

2. Background of the Invention

Digital processing circuits often require latches for temporarily storing digital signals when transferring such signals between circuits. Such applications include high-speed A/D and D/A converters, high-speed memories such as RAMs, ROMs, and EEPROMs, high-speed pipelined logic circuits, and other applications.

U.S. Pat. No. 5,767,717 discloses a high-performance dynamic logic compatible and scannable transparent latch for dynamic logic. The dynamic logic compatible and scannable transparent latch consists of a switchable input inverter, an output inverter and a switchable feed back inverter. Additionally, the known dynamic logic compatible latch consists of a transmission circuit, which provides for selectively connecting data or scan data to the latch. The single clock signal is a square wave having a high-level and a low-level, preferably equal to the upper reference voltage and the lower reference voltage, respectively. During the period that the single clock signal is in one state, as in the low-level, the latch is operating in a latch phase. When operating in a second state, such as the high-level, the latch operates in an evaluate phase. The known dynamic compatible latch has taken advantage of dynamic logic to simplify the latch design. Particularly it is designed for high-speed reaction to a falling edge.

The known latch is not compatible for static logic and is not a scannable multiport latch, i.e. a latch consisting of at least three data inputs. This can be seen in that the signal level at the data inputs of the known latch needs to be a high-level signal but not a low-level signal, in order to store the data signal in the known dynamic logic latch.

BRIEF SUMMARY OF THE INVENTION

It is an object of the present invention to provide a static logic compatible latch.

It is a further object of the present invention to provide a static logic compatible latch, which consists of multiple data inputs, i.e. a static logic compatible multiport latch.

It is another object of the present invention to provide a high performance static logic compatible multiport latch.

It is still another object of the present invention to provide a static logic compatible multiport latch, which is controlled by at least a first and a second clock.

It is yet another object of the present invention to provide a static logic multiport latch, which is operated by at least two clocks or clock signals and each being independent from the other clock signal.

It is another object of the present invention to provide a static logic compatible multiport latch, which consists of at least first data input ports and second data input ports.

It is a further object of the present invention to provide a static logic compatible multiport latch in which the data on the first data input ports are clocked faster through the static logic compatible multiport latch than data applied to the second data input ports.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawing in which the same reference signs have been used for the same parts or parts with the same or a similar effect, and in which.

DETAILED DESCRIPTION OF THE INVENTION

Figure 1:
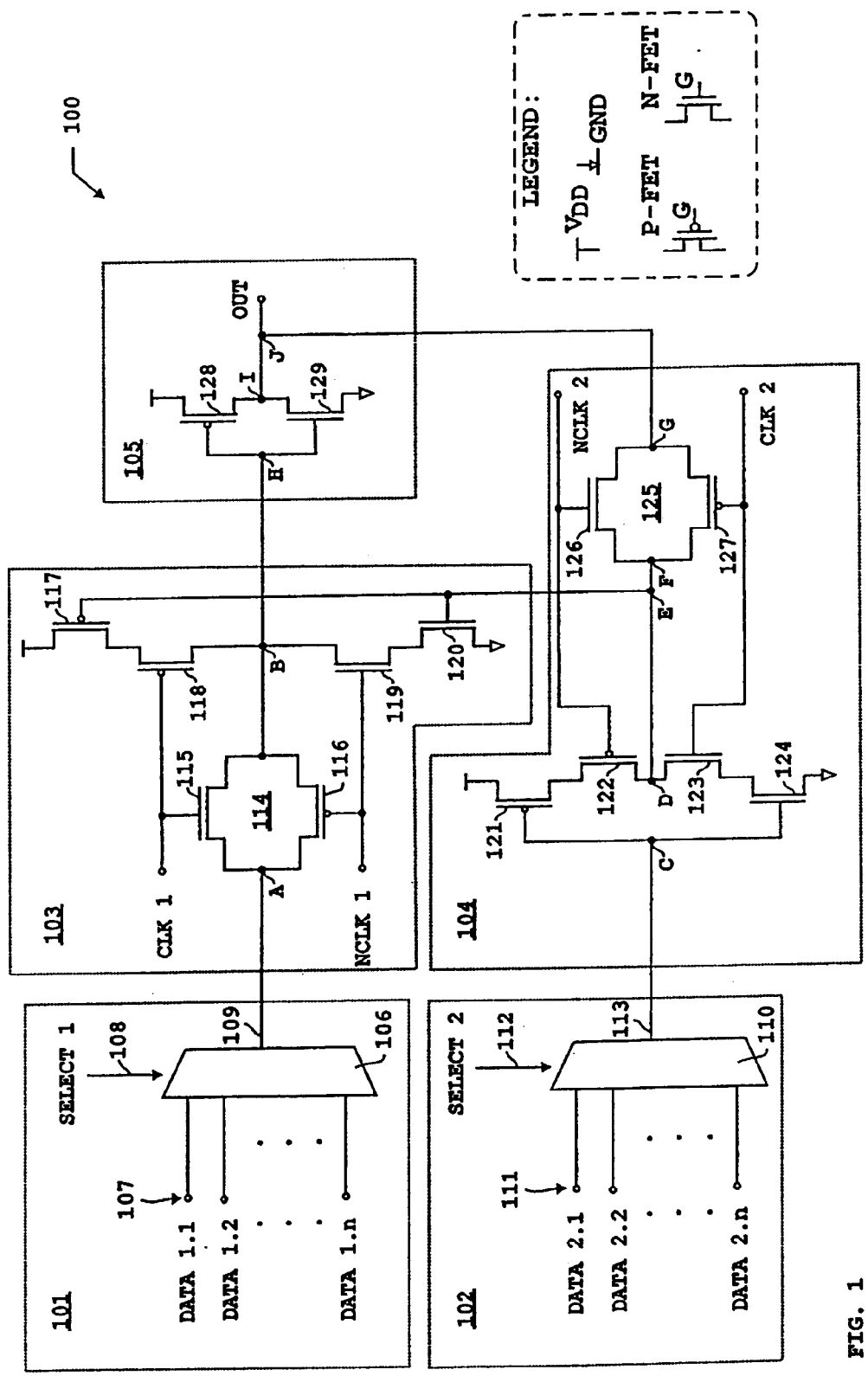
FIG. 1 shows a schematic illustration of the static logic compatible multiport latch according to the invention and a legend explaining details shown in the figure.

FIG. 1 shows a schematic illustration of a static logic compatible multiport latch 100 according to the invention consisting of an input multiplexor 101, an input multiplexor 102, a clock selector 103, a clock selector 104, and an output inverter 105.

The input multiplexor 101 consists of logic gates 106, such as a combination of AND gates and OR gates, as known by those skilled in the art, first data input ports 107, a select input 108, and a data output 109.

The input multiplexor 102 consists of multiple logic gates 110, such as a combination of AND and OR gates, as known by those skilled in the art, second data input ports 111, a data output 113 and a select input 112.

The clock selector 103 consists of a pass gate 114, two P-FETs 117 and 118 as well as two N-FETs 119 and 1 20. The pass gate 114 consists of an N-FET 115 and a P-FET 116. A first connection of the N-FET 115 with the P-FET 116 consists of a node A, which is connected with the data output 109 of the input multiplexor 101. A second connection between the N-FET 115 and the P-FET 116 consists of a node, which is connected with the node B and a node H of the output inverter 105. The P-FET 117 is connected with a high-level power potential VDD of a power supply (not shown) and the P-FET 118 as shown in FIG. 1. The P-FET 118 is connected with the N-FET 119 via the node B and the N-FET 119 is connected with the N-FET 120 and the N-FET 120 is connected to a low-level potential GND of the power supply (not shown). The gate of the N-FET 115 and the gate of the P-FET 118 is connected with the input CLK 1 of a first clock signal, the clock signal 1, as well as the gate of the P-FET 116 and the gate of the N-FET 119 is connected with an input NCLK of the inverted clock signal 1.

The clock selector 104 consists of a pass gate 125, a P-FET 121, a P-FET 122, an N-FET 123 and an N-FET 124. The P-FET 121 is connected to VDD and to the P-FET 122. The P-FET 122 is connected with the N-FET 123 and the connection between both of them consists of a node D. The N-FET 123 is connected with the N-FET 124 and the N-FET 124 is connected to GND as shown in FIG. 1. The gate of the P-FET 121 is connected with the gate of N-FET 124. The connection between the gates consists of a node C, which is connected with the data output 113 of the input multiplexor 102. The pass gate 125 consists of an N-FET 126 and a P-FET 127. The N-FET 126 is connected with the P-FET 127 via a first connection consisting of a node F and via a second connection consisting of a node G as shown in FIG. 1. The node D is connected with the node E and the node E is connected with the node F. The node E is connected with the gate of the N-FET 120 and the gate of the P-FET 117. The gate of the P-FET 127 is connected with the gate of the N-FET 123 as well as with an input CLK 2 of a second clock signal 2. The gate of the N-FET 126 of the pass gate 125 is connected with the gate of the P-FET 122 as well as with an input NCLK 2 of the inverted clock signal 2.

The output inverter 105 consists of a P-FET 128 and an N-FET 129. The P-FET 128 is connected with the high-level potential VDD of the power supply (not shown) and the N-FET 129 is connected with the low-level potential GND of the power supply as shown in FIG. 1. The P-FET 128 is connected with the N-FET 129 via a connection consisting of a node I and the node I is connected with the node J. The node J is connected with the node G and the output OUT of the output inverter 105. The gates of the P-FET 128 and the N-FET 129 are connected with each other via a connection consisting of a node H. The node H is connected with the node B of the clock selector 103.

In the following description, the operation of the static logic compatible latch 100 according to the invention will be described in detail.

In a first step, it is assumed that the clock signal 1 at the clock input CLK 1 consists of a high-level, while the clock signal 2 at the clock input CLK 2 consists of a low-level. In addition, it is assumed as an example, that DATA 1.1, a 0-bit or a 1-bit, has been selected in input multiplexor 101 via the select input 108 as known by those skilled in the art. Then, the pass gate 114 transfers the data selected at the input multiplexor 101, such as the DATA 1.1 in this example, present at the node A to the node B and to the node H. The input DATA 1.1 is inverted by the inverter formed by the combination of the P-FET 128 and the N-FET 129. Accordingly, the output OUT of the output inverter 105 consists of inverted input DATA 1.1 at its node J.

The high-level clock signal 1 at the clock input CLK 1 blocks the P-FET 118. The inverted clock signal 1, present at the input NCLK 1, blocks the N-FET 119.

The pass gate 125 transfers the inverted input DATA 1.1 at the node J and the node G to the node F and the node E. Inverted DATA 1.1 is inverted again by the P-FET 117 and the N-FET 120. However, inverted input DATA 1.1 is not transferred to the node B with the assumed settings for the clock input CLK 1, since the P-FETs 118 and 119 are blocked as already described.

In a second step, the clock signal 1 present at the input CLK 1 consists of a low-level and the clock signal 2 present at the input CLK 2 also consists of a low-level.

Then, the pass gate 114 blocks the transfer of the input DATA 1.1 from the node A to the node B. The P-FET 118 and the N-FET 119 are opened by the clock signal 1 and the inverted clock signal 1, and the node B is kept at DATA 1.1 level via the P-FETs 117 and 118 or via the N-FETs 19 and 120, depending on the DATA 1.1. The output OUT of the output inverter 105 is kept at the inverted DATA 1.1 level, which is latched into latch 100. In other words, the signal level on output OUT of the inverter 105 remains constant, although the clock signal 1 changes from a high-level to a low- level.

In a third step, the clock signal 1 consists of a low-level, while the clock signal 2 consists of a high-level. The pass gate 114 blocks the data present at the node A.

DATA 2.1, a 0-bit or a 1-bit, which has been selected via the select input 112 of the input multiplexor 102 as known by those skilled in the art, is transferred to the data output 113. The output data present at the data output 113 of the input multiplexor 102, which is present at the node C, is inverted by the inverter formed by the P-FET 121 and the N-FET 124. The clock signal 2 at the clock input CLK 2 opens the N-FET 123 and the inverted clock signal 2 at the clock input NCLK 2 opens the P-FET 122. The node D, the node E and the node F all consist of inverted DATA 2.1. The pass gate 125 is blocked by the clock signal 2 and the inverted clock signal 2.

The P-FET 118 and the N-FET 119 is opened and the inverter formed by the P-FET 117 and the N-FET 120 inverts the inverted DATA 2.1, i.e. the node B and the node H both consist of DATA 2.1, which is inverted by the inverter 105. The output OUT of the output inverter 105, the node 1, the node J and the node G each consist of the inverted DATA 2.1. The transfer of the inverted DATA 2.1 and node G is blocked by the pass gate 125.

In a fourth step, the clock signal 1 consists of a low-level and the clock signal 2 also consists of a low-level. The pass gate 125 transfers inverted DATA 2.1, present at node G, to the node F and the node E. The inverted DATA 2.1 is inverted by the inverter formed by the combination of the P-FET 117 and the N-FET 120 keeping the latch 100 in the previous state. The pass gate 114 blocks the transfer of the data on the node A. The DATA 2.1 is inverted by the output inverter 105 and the output OUT of the output inverter 105 consists of the inverted DATA 2.1 as before in the third step, i.e. the input DATA 2.1 is latched in latch 100. In other words, the signal level on output OUT of the inverter 105 remains constant, although the clock signal 2 changes from a high-level to a low-level from the third to the fourth step.

As will be seen from FIG. 1 and the above description, the DATA 1.1 to DATA 1.n, applied to the first data input ports 107 of the input multiplexor 101, pass only the pass gate 114 and a single inverter formed by the P-FET 128 and the N-FET 129 of the inverter 105 to be present in inverted form at the output OUT of the latch 100.

In contrast, the DATA 2.1 to DATA 2.n, applied to the second data input ports 111 of the input multiplexor 102, pass three inverters to be present at the output OUT of the output inverter 105 in an inverted form. The three inverters are formed by the P-FET 121 and the N-FET 124, the P-FET 117 and the N-FET 120 as well as the inverter 105.

Accordingly, the data applied to the first data input ports 107 of the input multiplexor 101 may be transferred to the output OUT of the output inverter 105 in inverted form significantly faster than the DATA 2.1 to DATA 2.n at the second data input ports 111 of the input multiplexor 102. Since the inverters have an associated capacitance which has to be re-charged when transferring different data, the clock frequency CLK 2 of the clock selector 104 may not be as high as the maximum possible clock frequency CLK 1 of the clock selector 103, under the assumption that all P-FETs and N-FETs have the same or similar characteristics. Accordingly, the static logic compatible latch 100 according to the invention allows to provide data at the output OUT of the output inverter 105 at a first, high clock frequency or at a second, lower clock frequency with regard to the first clock frequency. This is desired for certain applications of a static logic compatible multiport latch. As an example, the DATA 2.1, . . . , DATA 2.n may be scan data to test the function of the latch 100 or of further digital circuits co-operating with the latch 100.

To increase the clock frequency at which the static logic compatible multiport latch 100 may be operated, in a preferred embodiment of the invention, the P-FETs 117 and 118, as well as the FETs 119 and 120, are designed to consist of a low capacitance. Thereby, the amount of time necessary for re-charging the FETs and changing the voltage level of the node B via the pass gate 114 can be reduced, and the maximum clock frequency at which the static logic compatible multiport latch may be operated can be increased.

Although specific embodiments of the present invention have been illustrated in the accompanying drawing and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

What is claimed is:

1. A static logic compatible multiport latch comprising:
   a first clock and a second clock for controlling said latch;
   a first plurality of data input ports and a second plurality of data input ports, wherein said first clock controls whether data applied to said first plurality of data input ports is stored in or clocked through said latch, said second clock controls whether data applied to said second plurality of data input ports is stored in or clocked through said latch; and
   at least one data output.

2. The latch of claim 1, wherein data applied to said first plurality of data input ports have preference to be clocked into or through said latch over data applied to said second plurality of data input ports.

3. The latch of claim 1, wherein said first plurality of data input ports are input ports of a first multiplexor, the first multiplexor further comprising a select input and a data output.

4. The latch of claim 1, wherein said second plurality of data input ports are input ports of a second multiplexor, the second multiplexor further comprising a select input and a data output.

5. The latch of claim 1, wherein said data applied to said first plurality of data input ports are clocked into or through said latch at a first clock frequency.

6. The latch of claim 5, wherein said data applied to said second plurality of data input ports are clocked into or through said latch at a second clock frequency.

7. The latch of claim 6, wherein said first clock frequency is higher than the second clock frequency.

8. The latch of claim 1, wherein said data applied to said first plurality of data input ports only pass a single inverter to be present in an inverted form at said data output of said latch.

9. The latch of claim 1, wherein said data applied to said second plurality of data input ports pass three inverters to be present in an inverted form at said data output of said latch.

10. The latch of claim 1, wherein a capacitance of at least two FETs of a first clock selector is lower than a capacitance of at least two FETs of a second clock selector.

11. The latch of claim 1, wherein either said first clock or said second clock clocks data into said latch at the same time.

* * * * *